(12) United States Patent
Zhang

(10) Patent No.: US 10,593,740 B2
(45) Date of Patent: Mar. 17, 2020

(54) DISPLAY PANEL AND MANUFACTURING PROCESS THEREOF

(71) Applicant: SHENZHEN CHINA STAR OPTOELECTRONICS SEMICONDUCTOR DISPLAY TECHNOLOGY CO., LTD., Shenzhen, Guangdong (CN)

(72) Inventor: Liangfen Zhang, Guangdong (CN)

(73) Assignee: SHENZHEN CHINA STAR OPTOELECTRONICS SEMICONDUCTOR DISPLAY TECHNOLOGY CO., LTD., Shenzhen, Guangdong (CN)

( * ) Notice: Subject to any disclaimer, the term of this patent is extended or adjusted under 35 U.S.C. 154(b) by 0 days.

(21) Appl. No.: 16/460,741

(22) Filed: Jul. 2, 2019

(65) Prior Publication Data

US 2019/0326374 A1 Oct. 24, 2019

Related U.S. Application Data

(62) Division of application No. 15/574,538, filed as application No. PCT/CN2017/109534 on Nov. 6, 2017, now Pat. No. 10,388,707.

(30) Foreign Application Priority Data

Sep. 5, 2017 (CN) .......................... 2017 1 0788449

(51) Int. Cl.
| | |
|---|---|
| *H01L 27/32* | (2006.01) |
| *H01L 51/52* | (2006.01) |
| *H01L 51/05* | (2006.01) |
| *H01L 27/12* | (2006.01) |

(52) U.S. Cl.
CPC ...... *H01L 27/3246* (2013.01); *H01L 51/5234* (2013.01); *H01L 27/12* (2013.01); *H01L 51/0545* (2013.01); *H01L 51/5228* (2013.01); *H01L 2227/323* (2013.01)

(58) Field of Classification Search
CPC ............. H01L 51/5234; H01L 27/3246; H01L 2227/323; H01L 51/5228; H01L 51/0545; H01L 27/12
USPC ............. 257/40, 59, 72; 438/82, 99, 48, 128
See application file for complete search history.

(56) References Cited

U.S. PATENT DOCUMENTS

2010/0327275 A1* 12/2010 Saito et al. ......... H01L 51/5237
257/40

* cited by examiner

*Primary Examiner* — Thinh T Nguyen
(74) *Attorney, Agent, or Firm* — Hauptman Ham, LLP

(57) ABSTRACT

The present disclosure provides a display panel and a manufacturing process of the display panel. The manufacturing process of the display panel includes: successively depositing a plurality of thin-film layers on an auxiliary electrode layer, the compactness of a single thin-film layer among the plurality of thin-film layers gradually increasing from bottom to top; forming a preset pattern by the plurality of thin-film layers having a same width; dry-etching the plurality of thin-film layers so that the width of a single thin-film layer among the plurality of thin-film layers gradually increases from bottom to top, to form a plurality of cathode separators having an inverted trapezoid shape. The manufacturing process of the cathode separator is highly stable.

5 Claims, 5 Drawing Sheets

Step 1

Step 2

Step 3

Step 4

Step 1

Step 2

Step 3

Step 4

Step 5

Step 6

Step 7

DISPLAY PANEL AND MANUFACTURING PROCESS THEREOF

CROSS-REFERENCE TO RELATED APPLICATIONS

This application is a Divisional Application of U.S. application Ser. No. 15/574,538 filed Nov. 16, 2017, which is the National Phase application of International Application No. PCT/CN2017/109534 filed Nov. 6, 2017, and claims the priority of Chinese Patent Application No. 201710788449.2, filed on Sep. 5, 2017, in the State Intellectual Property Office, the disclosure of which is hereby incorporated in its entirety by reference herein.

BACKGROUND OF THE INVENTION

Field of the Invention

The present disclosure relates to the technical field of display technology, and more particularly to a display panel and a manufacturing process of the display panel.

Description of the Related Art

Existing display panels mainly include liquid crystal display (LCD) panels and OLED (organic light emitting diode) display panels. OLED display panels have been regarded as the most promising display panels due to their advantages of self-illumination, low driving voltage, high luminous efficiency, short response time, high definition and contrast, a viewing angle of approximately 180 degrees, wide available temperature range, the capability of flexible display and large-area full-color display, and the like. With the improvement in processes and manufacturing procedures of OLED display panels and the reduced cost, OLED TV sets have become more widespread and have been gradually known and accepted by consumers.

Due to their superior display characteristics and quality than LCDs, for example, lightweight, short response time, low driving voltage, better display color and display angle and the like, OLEDs have attracted extensive attention. In recent years, OLEDs develop dramatically. OLEDs may be used for curved display and their development tends to large-size applications. However, large-size applications will raise an IR drop issue, or even a Mura effect that is visible to the naked eyes. Therefore, technically, an auxiliary electrode and a plurality of cathode separators are provided to separate cathodes of OLEDs so as to control the cathodes separately. In this way, an effect of IR drop is reduced and the display quality is improved.

The conventional way of manufacturing a plurality of cathode separators is to form a plurality of cathode separators by applying an organic photoresist, exposing and then developing, wherein an inverted-trapezoid shape of the cathode separator is formed by controlling process parameters, which leads to low stability.

SUMMARY OF THE INVENTION

An objective of the present disclosure is to provide a display panel and a manufacturing process of the display panel, in order to solve the existing problem of low stability of the cathode separators.

For this purpose, the manufacturing process of the display panel provided by the present disclosure adopts the following technical solution:

A manufacturing process of a display panel, comprising the following steps of:
providing a substrate layer;
forming a plurality of thin-film transistors on the substrate layer;
forming a planarization layer on the thin-film transistors;
forming an auxiliary electrode layer on the planarization layer;
successively depositing a plurality of thin-film layers on the auxiliary electrode layer by chemical vapor deposition, the compactness of a single thin-film layer among the plurality of thin-film layers gradually increasing from bottom to top; the plurality of thin-film layers comprise at least three thin-film layers, and a difference in the compactness of adjacent thin-film layers among the plurality of thin-film layers gradually increases from bottom to top;
applying a photoresist onto the plurality of thin-film layers, exposing and developing to form a preset pattern, the plurality of thin-film layers forming the preset pattern having a same width;
dry-etching the plurality of thin-film layers so that the width of a single thin-film layer among the plurality of thin-film layers gradually increases from bottom to top; and
removing the photoresist applied onto the plurality of thin-film layers to form a plurality of cathode separators having an inverted trapezoid shape.

In the manufacturing process of a display panel of a preferred embodiment of the present disclosure, the step of successively depositing a plurality of thin-film layers on the auxiliary electrode layer comprises:
passing into the equipment for many times, with one thin-film layer being deposited on the auxiliary electrode layer whenever passing into the equipment.

In the manufacturing process of a display panel of a preferred embodiment of the present disclosure, the step of successively depositing a plurality of thin-film layers on the auxiliary electrode layer comprises:
passing into the equipment once, with a plurality of thin-film layers being deposited on the auxiliary electrode layer in several steps.

In the manufacturing process of a display panel of a preferred embodiment of the present disclosure, one or more of $SiN_x$, $N_2$, $NH_3$, TEOS, and $N_2O$ is fed during the manufacturing process.

In the manufacturing process of a display panel of a preferred embodiment of the present disclosure, the auxiliary electrode is formed of one or more of ITO, Mo, Al, Ti, Cu, and alloys thereof.

In the manufacturing process of a display panel of a preferred embodiment of the present disclosure, the planarization layer is a thin-film deposited by chemical vapor deposition.

A manufacturing process of a display panel, comprising the following steps of:
providing a substrate layer;
forming a plurality of thin-film transistors on the substrate layer;
forming a planarization layer on the thin-film transistors;
forming an auxiliary electrode layer on the planarization layer;
successively depositing a plurality of thin-film layers on the auxiliary electrode layer, the compactness of a single thin-film layer among the plurality of thin-film layers gradually increasing from bottom to top;

applying a photoresist onto the plurality of thin-film layers, exposing and developing to form a preset pattern, the plurality of thin-film layers forming the preset pattern having a same width;

dry-etching the plurality of thin-film layers so that the width of a single thin-film layer among the plurality of thin-film layers gradually increases from bottom to top; and removing the photoresist applied onto the plurality of thin-film layers to form a plurality of cathode separators having an inverted trapezoid shape.

In the manufacturing process of a display panel of a preferred embodiment of the present disclosure, the compactness of a single thin-film layer among the plurality of thin-film layers gradually increasing from bottom to top comprises:

the plurality of thin-film layers comprise at least three thin-film layers, and a difference in the compactness of adjacent thin-film layers among the plurality of thin-film layers gradually increases from bottom to top.

In the manufacturing process of a display panel of a preferred embodiment of the present disclosure, the compactness of a single thin-film layer among the plurality of thin-film layers gradually increasing from bottom to top comprises:

the plurality of thin-film layers comprise at least three thin-film layers, and a difference in the compactness of adjacent thin-film layers among the plurality of thin-film layers gradually decreases from bottom to top.

In the manufacturing process of a display panel of a preferred embodiment of the present disclosure, the step of successively depositing a plurality of thin-film layers on the auxiliary electrode layer comprises:

successively depositing a plurality of thin-film layers on the auxiliary electrode layer by chemical vapor deposition.

In the manufacturing process of a display panel of a preferred embodiment of the present disclosure, the step of successively depositing a plurality of thin-film layers on the auxiliary electrode layer comprises:

passing into the equipment for many times, with one thin-film layer being deposited on the auxiliary electrode layer whenever passing into the equipment.

In the manufacturing process of a display panel of a preferred embodiment of the present disclosure, the step of successively depositing a plurality of thin-film layers on the auxiliary electrode layer comprises:

passing into the equipment once, with a plurality of thin-film layers being deposited on the auxiliary electrode layer in several steps.

In the manufacturing process of a display panel of a preferred embodiment of the present disclosure, one or more of $SiN_x$, $N_2$, $NH_3$, TEOS, and $N_2O$ is fed during the manufacturing process.

In the manufacturing process of a display panel of a preferred embodiment of the present disclosure, the auxiliary electrode is formed of one or more of ITO, Mo, Al, Ti, Cu, and alloys thereof.

In the manufacturing process of a display panel of a preferred embodiment of the present disclosure, the planarization layer is a thin-film deposited by chemical vapor deposition.

A display panel, comprising:
a substrate layer;
a plurality of thin-film transistors formed on the substrate layer;
a planarization layer formed on the thin-film transistors;
an auxiliary electrode layer formed on the planarization layer; and a plurality of cathode separators formed on the auxiliary electrode layer, each of the cathode separators comprising a plurality of thin-film layers, the compactness of a single thin-film layer among the plurality of thin-film layers gradually increasing from bottom to top, the width of a single thin-film layer among the plurality of thin-film layers gradually increasing from bottom to top, the cathode separator having an inverted trapezoid shape.

In the display panel of a preferred embodiment of the present disclosure, the plurality of thin-film layers comprise at least three thin-film layers, and a difference in the compactness of adjacent thin-film layers among the plurality of thin-film layers gradually increases from bottom to top.

In the display panel of a preferred embodiment of the present disclosure, the plurality of thin-film layers comprise at least three thin-film layers, and a difference in the compactness of adjacent thin-film layers among the plurality of thin-film layers gradually decreases from bottom to top.

In the display panel of a preferred embodiment of the present disclosure, the auxiliary electrode is formed of one or more of ITO, Mo, Al, Ti, Cu, and alloys thereof.

In the display panel of a preferred embodiment of the present disclosure, the planarization layer is a thin-film deposited by chemical vapor deposition.

Compared with the conventional technology, the advantage of the present disclosure is as follows: each of the cathode separators is formed by a plurality of thin-film layers having a different compactness. The compactness of the plurality of thin-film layers gradually increases from bottom to top. Finally, dry-etching is performed. The cathode separators having an inverted trapezoid shape are formed due to the characteristics of the thin-films. The cathode separators formed in such a way has the advantages of high stability of the manufacturing process and high patterning uniformity. The manufacturing process of a plurality of cathode separators having an inverted trapezoid shape is simplified, and the efficiency is improved.

To make the contents of the present disclosure more apparent and understandable, the present disclosure will be described below in detail by preferred embodiments with reference to the accompanying drawings.

BRIEF DESCRIPTION OF THE DRAWINGS

The technical solution, as well as beneficial advantages, of the present disclosure will be apparent from the following detailed description of the specific embodiments of the present disclosure, with reference to the accompanying drawings.

DETAILED DESCRIPTION OF THE PREFERRED EMBODIMENTS

Figure 1:
FIG. 1 is a schematic view of the formation of a conventional cathode separator.
Figure 1:
Figure 1:
Figure 1:
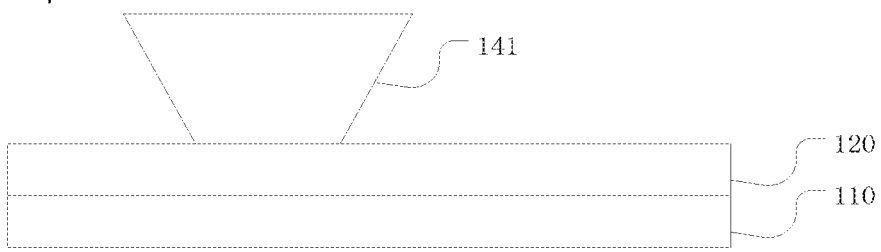

For better explaining the technical solution and the effect of the present disclosure, the present disclosure will be further described in detail with the accompanying drawings and the specific embodiments. The described embodiments are some but not all of the embodiments of the present disclosure. All other embodiments obtained by a person of ordinary skill in the art based on the embodiments of the present disclosure without creative efforts shall fall within the protection scope of the present disclosure.

In the drawings, similar structural units are designated by the same reference numerals.

A display panel and a manufacturing process of the display panel according to an embodiment of the present disclosure will be described below with reference to FIG. 1 to FIG. 5.

Figure 2:
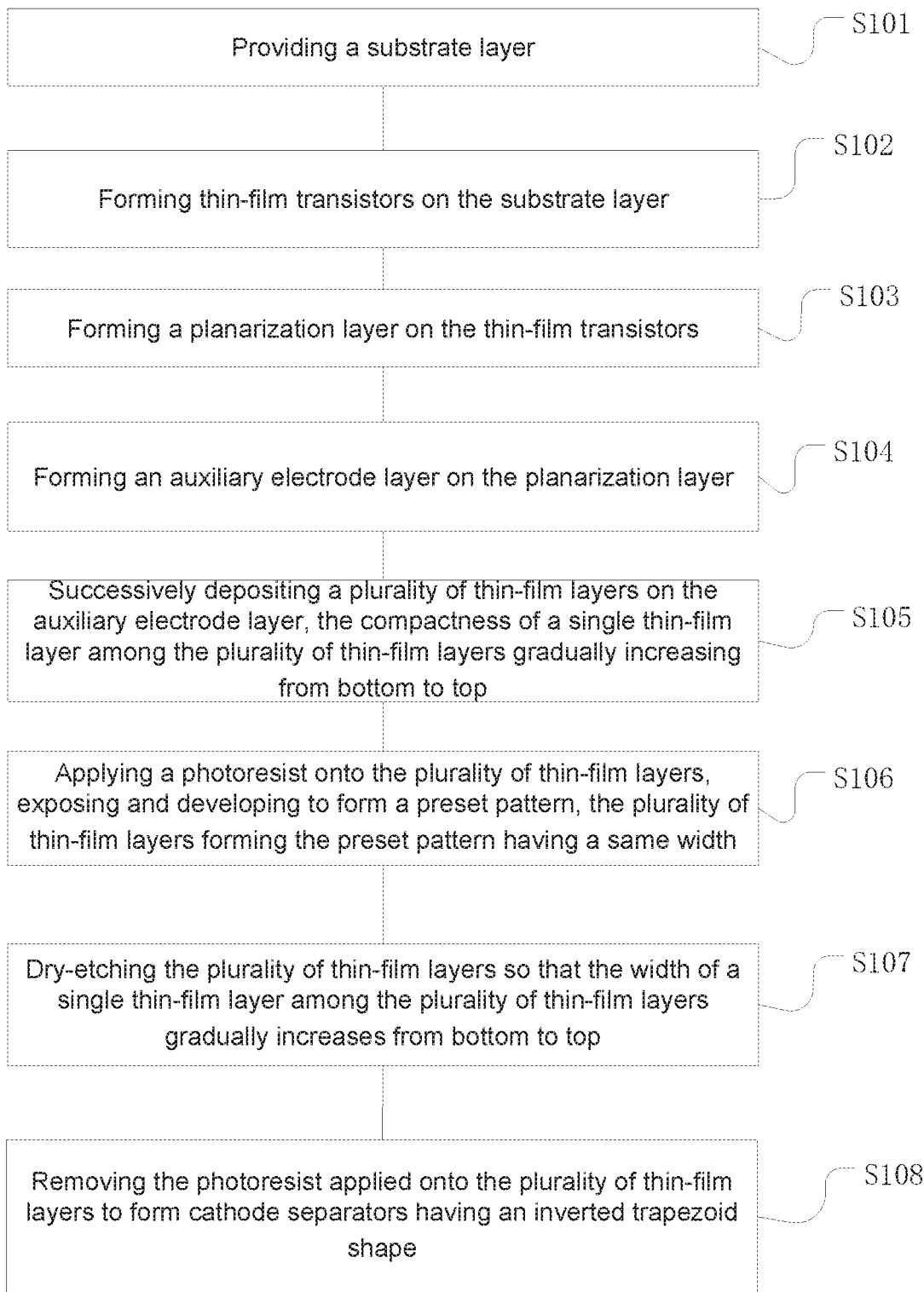
FIG. 2 is a flowchart of a manufacturing process of a display panel according to an embodiment of the present disclosure.
Figure 3:
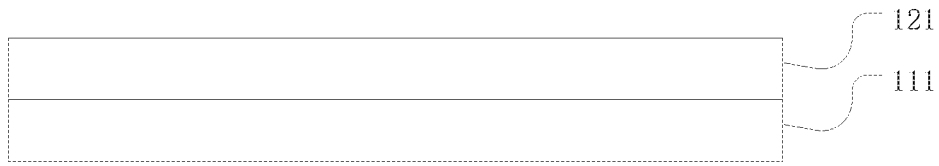
FIG. 3 is a schematic view of steps 1-3 for forming a plurality of cathode separators according to an embodiment of the present disclosure.
Figure 3:
Figure 3:
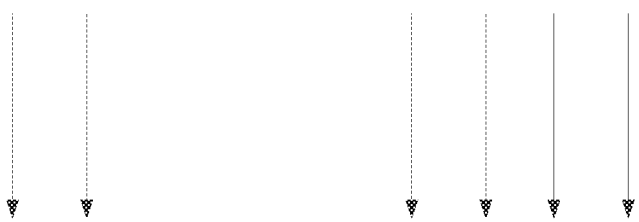
Figure 3:
Figure 4:
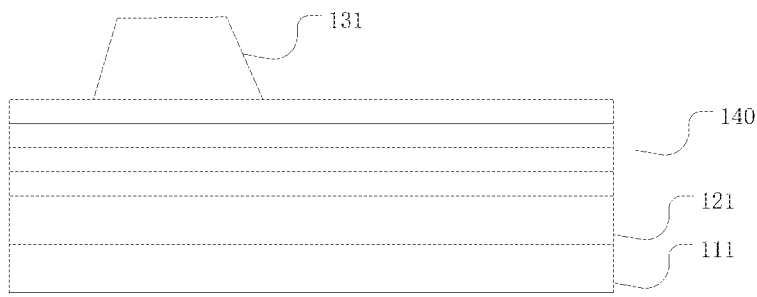
FIG. 4 is a schematic view of steps 4-7 for forming a plurality of cathode separators according to an embodiment of the present disclosure.
Figure 4:
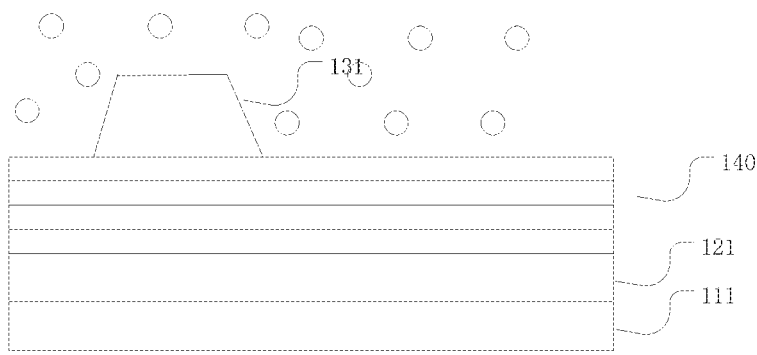
Figure 4:
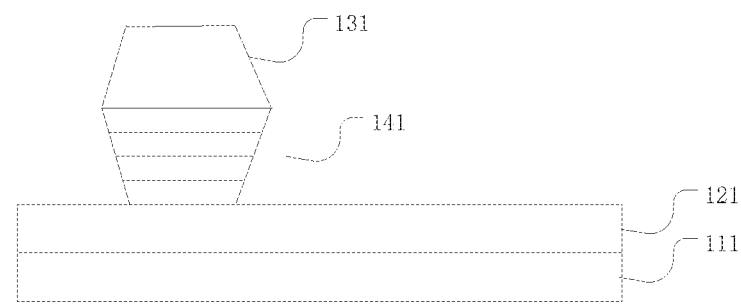
Figure 4:
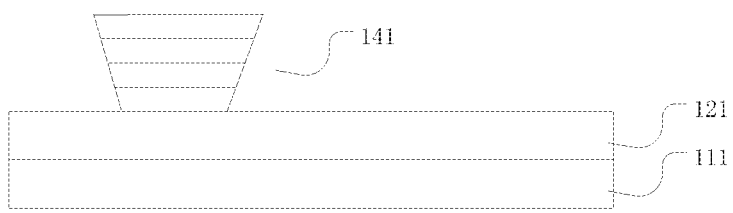
Figure 5:
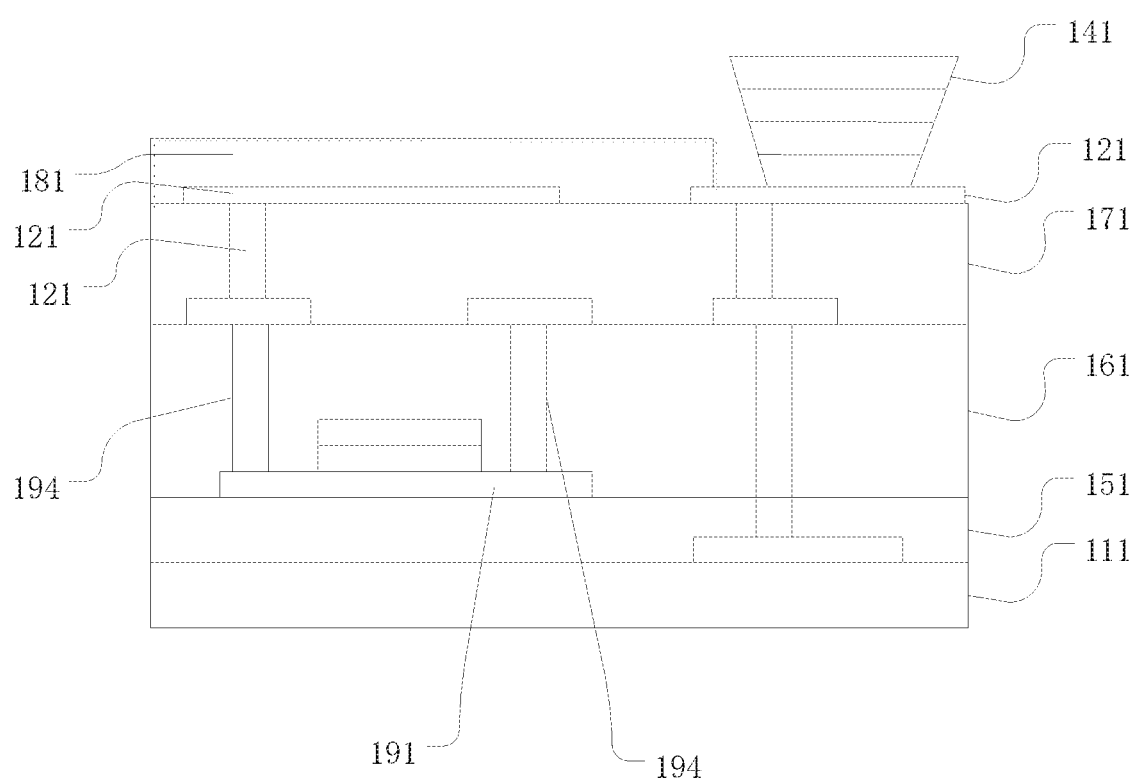
FIG. 5 is a schematic view of a display panel according to an embodiment of the present disclosure.

According to an embodiment of the present disclosure, as shown in FIGS. 1 to 5, FIG. 1 is a schematic view of the formation of a conventional cathode separator; FIG. 2 is a flowchart of a manufacturing process of a display panel according to an embodiment of the present disclosure; FIG. 3 is a schematic view of steps 1-3 for forming a plurality of cathode separators according to an embodiment of the present disclosure; FIG. 4 is a schematic view of steps 4-7 for forming a plurality of cathode separators according to an embodiment of the present disclosure; and FIG. 5 is a schematic view of a display panel according to an embodiment of the present disclosure.

As shown in FIG. 1, the manufacturing process of a conventional cathode separator comprises the following steps.

In the step 1, a substrate 110 is provided, on which a prepared TFT device (not shown) and an auxiliary electrode 120 are provided.

In the step 2, a layer of photoresist 130 is applied onto the auxiliary electrode 120.

In the step 3, the substrate applied with the photoresist 130 is exposed. In the step 4, the substrate is developed to form a plurality of cathode separators 141 having an inverted trapezoid shape.

As shown in FIG. 2, an embodiment of the present disclosure discloses a manufacturing process of a display panel, comprising the following steps S101-S108.

S101: A substrate layer is provided. The substrate layer may be a low temperature poly-silicon (LTPS) substrate. It may also be a glass substrate, a resin substrate or the like. It may also be an Oxide TFT or SPC or any TFT substrates.

S102: A plurality of thin-film transistors are formed on the substrate layer. A first metal layer is formed on the substrate layer, wherein the first metal layer comprises a plurality of gate lines; a first insulating layer is formed on the first metal layer; and a second metal layer is formed on the first insulating layer, wherein the second metal layer and the gate lines together form a plurality of thin-film transistors.

S103: A planarization layer is formed on the thin-film transistors. The planarization layer may be thin-film or PI material or a combination of both deposited by chemical vapor deposition (CVD).

S104: An auxiliary electrode layer is formed on the planarization layer. The auxiliary electrode may be made of metals such as Mo, Al, Ti and Cu, and alloys thereof, or may be made of ITO.

S105: A plurality of thin-film layers are successively deposited on the auxiliary electrode layer, the compactness of a single thin-film layer among the plurality of thin-film layers gradually increasing from bottom to top. The plurality of thin-film layers may be successively deposited on the auxiliary electrode layer by chemical vapor deposition.

S106: A photoresist is applied onto the plurality of thin-film layers, exposed and developed to form a preset pattern, the plurality of thin-film layers forming the preset pattern having a same width.

S107: The plurality of thin-film layers are dry-etched so that the width of a single thin-film layer among the plurality of thin-film layers gradually increases from bottom to top.

S108: The photoresist applied onto the plurality of thin-film layers is removed to form a plurality of cathode separators, wherein each of the cathode separators has an inverted trapezoid shape.

In the embodiment of the present disclosure, each of the cathode separators is formed by a plurality of thin-film layers having a different compactness. The compactness of the plurality of thin-film layers gradually increases from bottom to top. Finally, dry-etching is performed. The cathode separators having an inverted trapezoid shape are formed due to the characteristics of the thin-films. The cathode separators formed in such a way has the advantages of high stability of the manufacturing process and high patterning uniformity. The manufacturing process of a plurality of cathode separators having an inverted trapezoid shape is simplified, and the efficiency is improved.

Optionally, the compactness of a single thin-film layer among the plurality of thin-film layers gradually increasing from bottom to top specifically comprises:

the plurality of thin-film layers comprise at least three thin-film layers, and a difference in the compactness of adjacent thin-film layers among the plurality of thin-film layers gradually increases from bottom to top.

With such a design, a difference in the compactness of adjacent thin-film layers among the plurality of thin-film layers gradually increases from bottom to top. After the subsequent dry-etching, a difference in the width of adjacent thin-film layers gradually increases. That is, a difference in the width of a bottom base and the width of a top base of the inverted trapezoid shape gradually increases. The space occupied by the cathode separators becomes smaller. The space is saved.

Optionally, the compactness of a single thin-film layer among the plurality of thin-film layers gradually increasing from bottom to top specifically comprises:

the plurality of thin-film layers comprise at least three thin-film layers, and a difference in the compactness of adjacent thin-film layers among the plurality of thin-film layers gradually decreases from bottom to top.

With such a design, a difference in the compactness of adjacent thin-film layers among the plurality of thin-film layers gradually decreases from bottom to top. After the subsequent dry-etching, a difference in the width of adjacent thin-film layers gradually decreases. That is, a difference in the width of a bottom base and the width of a top base of the inverted trapezoid shape gradually decreases. The stability of the cathode separators becomes better. Cathodes of OLEDs can be controlled separately by separating the cathodes using the cathode separators so that an elect of IR drop can be reduced. Thus, the display problem is solved and the display quality is improved.

Further, one or more of $SiN_x$, $N_2$, $NH_3$, TEOS, and $N_2O$ is fed during the manufacturing process. This can ensure the stability during the manufacturing process and increase the success rate.

In some embodiments, the etching may be inductively coupled plasma (ICP) or enhanced cathode couple plasma mode (ECCP) or reactive ion etching (RIE) or any etching process.

In some embodiments, after forming a plurality of cathode separators having an inverted trapezoid shape, a subsequent evaporation process is continuously performed. The subsequent evaporation process contains organic material and a plurality of cathodes which are separated by the cathode separators.

Optionally, the step of successively depositing a plurality of thin-film layers on the auxiliary electrode layer comprises:

passing into the equipment for many times, with one thin-film layer being deposited on the auxiliary electrode layer whenever passing into the equipment. The deposition effect will be better.

Optionally, the step of successively depositing a plurality of thin-film layers on the auxiliary electrode layer comprises:

passing into the equipment once, with a plurality of thin-film layers being deposited on the auxiliary electrode layer in several steps. The operation steps are simplified.

In some embodiments, in addition to the arrangement of the cathode separators on the auxiliary electrode layer, the cathode separators may be arranged on a pixel define layer (PDL) or on a bank layer.

The manufacturing process of a display panel in accordance with this implementation may be applicable to a common display panel, and may also be applicable to AMOLED or UP techniques.

As shown in FIG. 3 and FIG. 4, the manufacturing process of the cathode separators in this embodiment comprises the following steps.

In the step 1, a substrate 111 is provided, on which a prepared TFT device (not shown) and an auxiliary electrode 121 are provided.

In the step 2, a CVD thin-film 140 is deposited on the auxiliary electrode 121. The CVD thin-film 140 is deposited for many times and becomes more compact from bottom to top.

In the step 3, a photoresist 131 is applied onto the CVD thin-film 140 and the CVD thin-film 140 is then exposed.

In the step 4, the CVD thin-film 140 is developed to form an image.

In the step 5, dry-etching is performed to remove the CVD thin-film 140 exposed from the photoresist.

In the step 6, after the dry-etching, since the CVD thin-film 140 gradually loosens from top to bottom, a plurality of separators 131, 141 having an inverted trapezoid shape are formed.

In the step 7, after the photoresist is peeled off, the cathode separators 141 formed of the CVD thin-film are formed.

As shown in FIG. 5, an embodiment of the present disclosure further discloses a display panel comprising a substrate layer 111, a plurality of thin-film transistors, a planarization layer 171, an auxiliary electrode layer 121 and a plurality of cathode separators 141.

The substrate layer may be a low temperature (LTPS) substrate. It may be a glass substrate, a resin substrate or the like. It may also be an Oxide TFT or SPC or any TFT substrates. The thin-film transistors are formed on the substrate layer.

The planarization layer 171 is formed on the thin-film transistors. The planarization layer 171 may be thin-film or PI material or a combination of both deposited by chemical vapor deposition (CVD).

The auxiliary electrode layer 121 is formed on the planarization layer. The auxiliary electrode 121 may be made of metals such as Mo, Al, Ti and Cu, and alloys thereof, or may be made of ITO.

The cathode separators 141 are formed on the auxiliary electrode layer 121. Each of the cathode separators 141 comprises a plurality of thin-film layers. The compactness of a single thin-film layer 140 among the plurality of thin-film layers gradually increases from bottom to top, and the width of a single thin-film layer 140 among the plurality of thin-film layers gradually increases from bottom to top. Each of the cathode separators 141 has an inverted trapezoid shape.

In this embodiment of the present disclosure, each of the cathode separators 141 is formed by a plurality of thin-film layers 140 having a different compactness. The compactness of the plurality of thin-film layers gradually increases from bottom to top. Finally, dry-etching is performed. The cathode separators each having an inverted trapezoid shape are formed due to the characteristics of the thin-films. The cathode separators formed in such a way have the advantages of high stability of the manufacturing process and high patterning uniformity. The manufacturing process of a plurality of cathode separators having an inverted trapezoid shape is simplified, and the efficiency is improved.

Optionally, the plurality of thin-film layers comprise at least three thin-film layers, and a difference in the compactness of adjacent thin-film layers among the plurality of thin-film layers gradually increases from bottom to top.

With such a design, a difference in the compactness of adjacent thin-film layers among the plurality of thin-film layers gradually increases from bottom to top. After the subsequent dry-etching, a difference in the width of adjacent thin-film layers gradually increases. That is, a difference in the width of a bottom base and the width of a top base of the inverted trapezoid shape gradually increases. The space occupied by the cathode separators becomes smaller. The space is saved.

Optionally the plurality of thin-film layers comprise at least three thin-film layers, and a difference in the compactness of adjacent thin-film layers among the plurality of thin-film layers gradually decreases from bottom to top.

With such a design, a difference in the compactness of adjacent thin-film layers among the plurality of thin-film layers gradually decreases from bottom to top. After the subsequent dry-etching, a difference in the width of adjacent thin-film layers gradually decreases. That is, a difference in the width of a bottom base and the width of a top base of the inverted trapezoid shape gradually decreases. The stability of the cathode separators becomes better. The cathodes can be controlled separately by separating the cathodes so that an effect of IR drop can be reduced. Thus, the display problem is solved and the display quality is improved.

In some embodiments, in addition to the arrangement of the cathode separators 141 on the auxiliary electrode layer 121, the cathode separators 141 may be arranged on a pixel define layer (PDL) 181 or on a bank layer.

The display panel may further comprise a first insulating layer 151, a first metal layer and a second insulating layer 161.

The first insulating layer 151 is arranged on the substrate 111. The first metal layer is arranged on the first insulating layer 151 and comprises a gate line 191, 194. The second insulating layer 161 is arranged on the first metal layer.

Although the present disclosure has been described with reference to the preferred embodiment thereof, it is apparent to those skilled in the art that a variety of modifications and changes may be made without departing from the scope of the present disclosure which is intended to be defined by the appended claims.

What is claimed is:

1. A display panel, comprising:
a substrate layer;
a plurality of thin-film transistors formed on the substrate layer;
a planarization layer formed on the thin-film transistors;
an auxiliary electrode layer formed on the planarization layer; and
a plurality of cathode separators formed on the auxiliary electrode layer, each of the cathode separators comprising a plurality of thin-film layers, the compactness of a single thin-film layer among the plurality of thin-film layers gradually increasing from bottom to top, the width of a single thin-film layer among the plurality of thin-film layers gradually increasing from bottom to top, each of the cathode separator having an inverted trapezoid shape.

2. The display panel as claimed in claim 1, wherein the plurality of thin-film layers comprise at least three thin-film layers, and a difference in the compactness of adjacent thin-film layers among the plurality of thin-film layers gradually increases from bottom to top.

3. The display panel as claimed in claim 1, wherein the plurality of thin-film layers comprise at least three thin-film layers, and a difference in the compactness of adjacent thin-film layers among the plurality of thin-film layers gradually decreases from bottom to top.

4. The display panel as claimed in claim 1, wherein the auxiliary electrode is formed of one or more of ITO, Mo, Al, Ti, Cu, and alloys thereof.

5. The display panel as claimed in claim 1, wherein the planarization layer is a thin-film deposited by chemical vapor deposition.

* * * * *